(12) United States Patent
Luan et al.

(10) Patent No.: US 11,409,202 B2
(45) Date of Patent: Aug. 9, 2022

(54) DIGITAL EXPOSURE CONTROL METHOD AND APPARATUS

(71) Applicant: BOE Technology Group Co., Ltd., Beijing (CN)

(72) Inventors: Xinglong Luan, Beijing (CN); Fuqiang Li, Beijing (CN); Jing Feng, Beijing (CN); Zhichong Wang, Beijing (CN); Peng Liu, Beijing (CN); Guangcai Yuan, Beijing (CN); Xue Dong, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/199,395

(22) Filed: Mar. 11, 2021

(65) Prior Publication Data

US 2021/0389682 A1    Dec. 16, 2021

(30) Foreign Application Priority Data

Jun. 10, 2020 (CN) .......................... 202010524964.1

(51) Int. Cl.
*G03F 7/20* (2006.01)
*G02B 26/08* (2006.01)

(52) U.S. Cl.
CPC ..... *G03F 7/70291* (2013.01); *G02B 26/0833* (2013.01)

(58) Field of Classification Search
CPC ........................ G02F 7/70291; G02B 26/0833
See application file for complete search history.

(56) References Cited

U.S. PATENT DOCUMENTS

| | | | |
|---|---|---|---|
| 6,641,981 B1 * | 11/2003 | Kaneko | G03F 7/70066 430/311 |
| 6,891,175 B2 * | 5/2005 | Hiura | G03B 27/42 250/492.2 |
| 7,800,080 B2 * | 9/2010 | Tanaka | H01L 21/02691 250/492.2 |

* cited by examiner

*Primary Examiner* — Hung V Nguyen
(74) *Attorney, Agent, or Firm* — Ling Wu; Stephen Yang; Ling and Yang Intellectual Property

(57) ABSTRACT

Provided is a digital exposure control method, including: performing exposure of different types of functional areas of a substrate to be exposed through one or a plurality of full-page scans, wherein scan speeds for different types of functional areas of the substrate to be exposed are different.

19 Claims, 9 Drawing Sheets

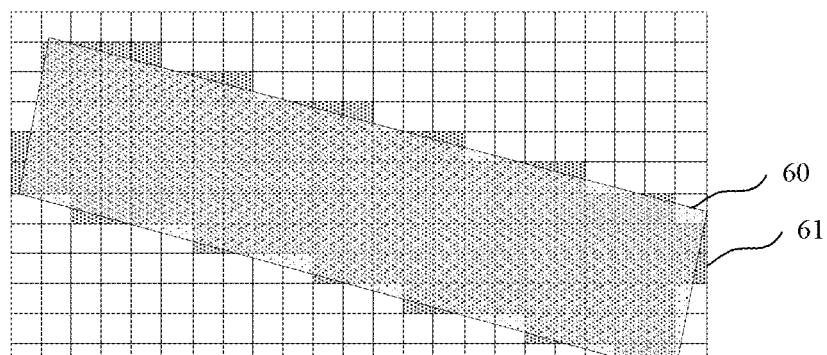
(a)
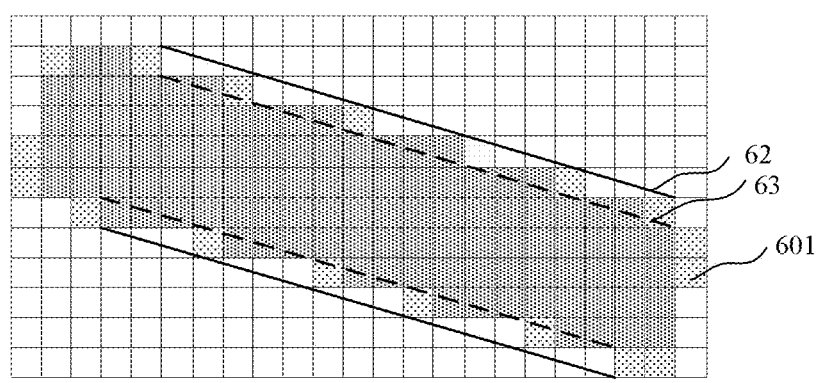
(b)
FIG. 15
FIG. 16

DIGITAL EXPOSURE CONTROL METHOD AND APPARATUS

CROSS-REFERENCE TO RELATED APPLICATION

The present application claims the priority of Chinese Patent Application No. 202010524964.1 filed to the CNIPA on Jun. 10, 2020, the entire content of which is hereby incorporated by reference.

TECHNICAL FIELD

The present disclosure relates to, but is not limited to, the technical field of display, in particular to a digital exposure control method and apparatus.

BACKGROUND

Lithography is often used in a manufacturing process of display devices. The traditional lithography is to transform a design layout pattern into a solid mask, then irradiate the precise mask with ultraviolet light, and the ultraviolet light through gaps of the mask pattern optically reacts with the photoresist, thus the pattern on the mask is fully transferred to a glass substrate. With the development of technology, a digital lithography process may also be used at present. The digital lithography process is to transform a design layout pattern into a virtual mask, and transfer a pattern on the virtual mask to a glass substrate by a digital exposure machine, which can greatly reduce the production cost.

SUMMARY

The following is a summary of subject matter described in detail herein. This summary is not intended to limit the protection scope of the claims.

In an aspect, an embodiment of the present disclosure provides a digital exposure control method, including: performing exposure of different types of functional areas of a substrate to be exposed through one or multiple full-page scans, wherein scan speeds for different types of functional areas of the substrate to be exposed are different.

In another aspect, an embodiment of the present disclosure provides a digital exposure control apparatus, including a memory and a processor, wherein a computer program is stored in the memory, and when the computer program is executed by the processor, the digital exposure control method described above is implemented.

In another aspect, an embodiment of the present disclosure provides a non-transitory computer readable storage medium storing a computer program. The digital exposure control method described above is implemented when the computer program is executed.

In another aspect, an embodiment of the present disclosure provides a digital exposure machine, including the above-mentioned digital exposure control apparatus, a platform for bearing a substrate to be exposed, and a scan part.

Other features and advantages of the present disclosure will be set forth in the following specification, and in part will become apparent from the specification, or be learned by practice of the present disclosure. Other advantages of the present disclosure may be achieved and obtained by the schemes described in the specification and drawings of the description.

Other aspects will become apparent after the drawings and the detailed description are read and understood.

BRIEF DESCRIPTION OF DRAWINGS

Drawings are used to provide an understanding of technical schemes of the present disclosure and form a part of the specification. Together with embodiments of the present disclosure, the drawings are used to explain technical schemes of the present disclosure and do not constitute a limitation on the technical schemes of the present disclosure.

FIGS. 7(a) to 7(c), is schematic diagrams of multiple full-page scans of at least one embodiment of the present disclosure.

FIG. 8(a) and FIG. 8(b), is example diagrams of a full-page scan of at least one embodiment of the present disclosure.

FIG. 15, including FIG. 15(a) and FIG. 15(b), is example diagrams of obtaining a pattern to be exposed of at least one embodiment of the present disclosure.

FIG. 16 is a schematic diagram of DMD micromirror reusing of at least one embodiment of the present disclosure.

DETAILED DESCRIPTION

Figure 1:
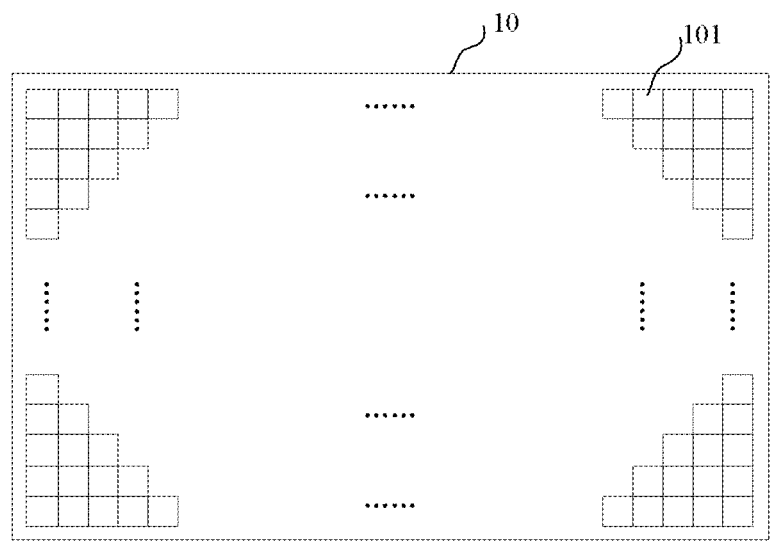
FIG. 1 is a schematic diagram of a DMD array of a digital exposure machine.

Multiple embodiments are described in the present disclosure, but the description is exemplary rather than limiting, and it is apparent to those of ordinary skills in the art that there may be more embodiments and implementation schemes within the scope of the embodiments described in the present disclosure. Although many possible combinations of features are shown in the drawings and discussed in the embodiments, many other combinations of the disclosed features are also possible. Unless specifically limited, any feature or element of any embodiment may be used in combination with or in place of any other feature or element of any other embodiment.

The present disclosure includes and contemplates combinations of features and elements known to those of ordinary skilled in the art. The disclosed embodiments, features and elements of the present disclosure may be combined with any conventional features or elements to form a unique scheme defined by the claims. Any feature or element of any embodiment may also be combined with features or elements from other schemes to form another unique scheme defined by the claims. Therefore, it should be understood that any feature shown or discussed in the present disclosure may be implemented individually or in any suitable combination. Thus, the embodiments are not otherwise limited except in accordance with the appended claims and equivalents thereof. In addition, one or more modifications and alterations may be made within the protection scope of the appended claims.

Furthermore, when describing representative embodiments, the specification may have presented a method or process as a specific order of acts. However, to the extent that the method or process does not depend on the specific order of acts described herein, the method or process should not be limited to the specific order of acts described. As those of ordinary skills in the art will understand, other orders of acts are also possible. Therefore, the specific order of acts set forth in the specification should not be interpreted as a limit to the claims. Furthermore, the claims for the method or process should not be limited to performing the acts in the order of its acts, and those skilled in the art can easily understand that these orders may be varied but still remain within the essence and scope of the embodiments of the present disclosure.

In the drawings, a size of a constituent element, or a thickness of a layer or an area, is sometimes exaggerated for clarity. Therefore, an implementation of the present disclosure is not necessarily limited to the size shown, and a shape and size of each component in the drawings do not reflect true proportions. In addition, the drawings schematically show ideal examples, and an implementation of the present disclosure is not limited to the shapes or values shown in the drawings.

Unless otherwise defined, technical terms or scientific terms used in the present disclosure shall have ordinary meanings understood by those of ordinary skills in the art to which the present disclosure belongs. The words "first", "second" and the like used in the present disclosure do not indicate any order, number or importance, but are only used to distinguish different components. In the present disclosure, "multiple" may mean two or more than two. Similar words such as "including" or "comprising" mean that elements or articles preceding the words cover elements or articles listed after the words and their equivalents, and do not exclude other elements or articles.

In the present disclosure, similar terms such as "connect", "couple" or "link" are not limited to physical or mechanical connections, but may include direct or indirect electrical connections. "Electrical connection" includes a case where constituent elements are connected together through an element with certain electrical effects. The "element having a certain electrical effect" is not particularly limited as long as it can transmit and receive electrical signals between connected constituent elements. Examples of "the element with the certain electrical effect" not only include an electrode and wiring, but also a switching element such as a transistor, a resistor, an inductors, a capacitor, and another element with one or more functions.

In the present disclosure, "parallel" refers to a state in which an angle formed by two straight lines is greater than or equal to $-10°$ and less than or equal to $10°$, and thus also includes a state in which the angle is greater than or equal to $-5°$ and less than or equal to $5°$. In addition, "perpendicular" refers to a state in which two straight lines form an angle of greater than or equal to $80°$ and less than or equal to $100°$, and thus also includes a state of an angle greater than or equal to $85°$ and less than or equal to $95°$.

In order to make the following description of the embodiments of the present disclosure clear and concise, detailed description of some of known functions and known components are omitted in the present disclosure. The drawings of the embodiments of the present disclosure only relate to structures involved in the embodiments of the present disclosure, and for other structures, general designs may be referred to.

A digital exposure machine may include a platform for bearing a substrate to be exposed and a scan part. The scan part may include multiple lenses (for example, laser heads) and a Digital Micromirror Device (DMD) array. Light emitted by an optical source in the lens may be reflected to the micromirrors of the DMD array through a reflective lens, and the reflection of the light may be modulated by turned-on or turned-off of multiple micromirrors to obtain a pattern to be exposed, and the substrate to be exposed disposed on the platform is exposed.

FIG. 1 is a schematic diagram of a DMD array of a digital exposure machine. As shown in FIG. 1, a DMD array 10 may include multiple regularly arranged micromirrors 101. In some exemplary embodiments, the DMD array may include 2560×1600 micromirrors. Exposure of the substrate to be exposed may be implemented by controlling the turned-on or turned-off of multiple micromirrors. Generally, a size of the DMD array is smaller than a size of the substrate to be exposed, so the digital exposure machine needs to scan for multiple times to complete the exposure of the substrate to be exposed. During an exposure process, a position of the scan part may be fixed, and the platform for bearing the substrate to be exposed may move according to a preset rule, so that the digital exposure machine can scan the substrate to be exposed for multiple times.

Figure 2:
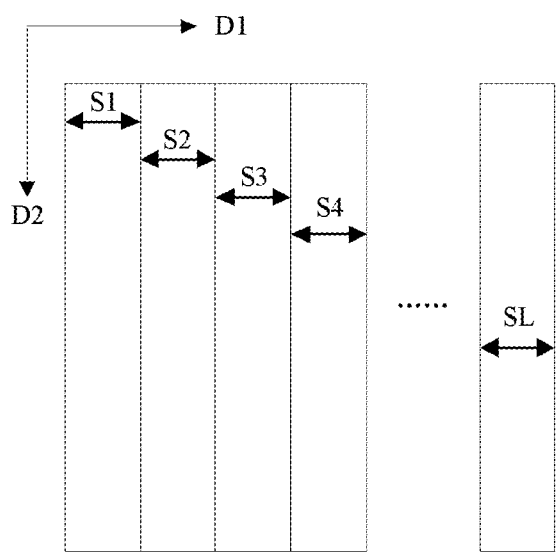
FIG. 2 is a schematic diagram of an exposure path of a digital exposure machine.

The digital exposure machine may expose the substrate to be exposed in a progressive scan mode. FIG. 2 is a schematic diagram of an exposure path of a digital exposure machine. As shown in FIG. 2, the substrate to be exposed may be divided into L areas along a first direction D1, for example, from area S1 to area SL, where L is an integer greater than 0. During the scan, the substrate to be exposed may first move along a second direction D2 from a start position, so that the scan part scans an area extending along the second direction D2 in the progressive scan mode to implement the exposure; after the exposure of this area is completed, the substrate to be exposed may be translated along the first direction D1, translated to a next adjacent area and continue to move along the second direction D2 to complete the exposure of this adjacent area. According to the above rule, L areas may be scanned in turn to complete the exposure of the whole substrate to be exposed. Herein, an area may be exposed by the progressive scan along the second direction D2, that is, a group of scans along the second direction D2 may complete the exposure of an area. For example, the first group of scans may complete the exposure of the area S1, the second group of scans may complete the exposure of the area S2, and the $L^{th}$ group of scans may complete the exposure of the area SL. Each group of scans may include multiple scans performed in turn along the second direction D2. Multiple groups of scans required for a full scan of the whole substrate to be exposed may be called a full-page scan. In some examples, a width of one scan along the first direction D1 may be about 2.6 microns (μm), and a length of one group of scans along the second direction D2 may be 6500 millimeters (mm).

However, a splicing position of two adjacent scans and a splicing position of two adjacent groups of scans may be present in a pixel area to split pixels, which leads to dislocation and position splicing difference of the exposed pixel patterns to form a Critical Dimension (CD) difference, thereby resulting in display Mura of digital exposure products and reducing the yield of exposed products. Moreover, when a multi-lens parallel direct writing technology is used for exposure, a slight difference of optical devices between lenses will also cause Mura. The term "Mura" comes from Japanese and mainly refers to a phenomenon of uneven light and shade. Mura is a common phenomenon in a manufacturing process of display substrates, and defects brought by the Mura have a significant impact on a picture quality. In addition, efficiency of the current digital exposure machine is relatively low, and Tact Time (TT) is too long, which affects productivity of exposure products.

A digital exposure control method and apparatus provided by embodiments of the present disclosure can improve the display Mura and the excessive tact time in the digital exposure, thereby improving the yield and productivity of digital exposure products.

A digital exposure control method provided by an embodiment of the present disclosure includes: performing an exposure of different types of functional areas of a substrate to be exposed through one or multiple full-page scans, wherein scan speeds for different types of functional areas of the substrate to be exposed are different. In this embodiment, the same type of functional areas may have the same requirement for exposure homogeneity, and different types of functional areas may have different requirements for exposure homogeneity. In this embodiment, different scan speeds are used to scan and expose functional areas with different exposure homogeneity requirements, which can ensure the display homogeneity in the same type of functional areas and improve the exposure efficiency.

In some exemplary embodiments, the substrate to be exposed may include one or more display substrates. Sizes of multiple display substrates may be the same or different. Each display substrate may include two types of functional areas, i.e., a display area and a non-display area located in the surrounding of the display area. Herein, the display area may be provided with pixel cells arranged in an array. The non-display area may include a fanout area, a dummy area, etc. The requirement for exposure homogeneity of the display area may be higher than that of the non-display area. However, the present embodiment is not limited thereto.

In some exemplary embodiments, different types of functional areas may have different priorities. When the exposure of different types of functional areas of the substrate to be exposed is performed through one full-page scan, change of a scan speed may occur in a functional area with a low priority. In some examples, taking two types of functional areas, the display area and the non-display area, as an example, a priority of the display area may be higher than that of the non-display area. In a full-page scan process, a scan speed of the display area (for example, which is called a first scan speed) may be different from that of the non-display area (for example, which is called a second scan speed). During a process of scan from the display area to the non-display area, the scan speed may change, and the change of the scan speed may occur in a process of scan the non-display area. In other words, the scan speed may remain unchanged during scan the display area, and the scan speed may change from the first scan speed into the second scan speed during a process of scan the non-display area.

In some exemplary embodiments, when scan areas of different lenses of the digital exposure machine correspond to different types of functional areas in any scan of a full-page scan, a scan speed corresponding to a functional area with a high priority may be used for this scan. In some examples, taking two types of functional areas, the display area and the non-display area, as an example, a priority of the display area may be higher than that of the non-display area. In a scan of a full-page scan, when scan areas of a part of lenses of the digital exposure machine correspond to the display area, while scan areas of the rest lenses correspond to the non-display area, the scan speed corresponding to the display area may be used for this scan. In this way, the exposure homogeneity of the display area with the higher priority can be ensured.

In some exemplary embodiments, when the exposure of different types of functional areas of the substrate to be exposed is performed through multiple full-page scans, the same type of functional areas may be exposed through the same full-page scan. In this exemplary embodiment, the same type of functional areas may be exposed in the same full-page scan, and different types of functional areas may be exposed in different full-page scans. Taking two types of functional areas, display area and non-display area, as an example, the display area may be exposed in the first full-page scan, and the non-display area may be exposed in the second full-page scan; or, the non-display area may be exposed in the first full-page scan, and the display area may be exposed in the second full-page scan. However, the present embodiment is not limited thereto.

In some exemplary embodiments, different types of functional areas may have different priorities. According to an order of priorities of different types of functional areas, multiple full-page scans may be used to perform the exposure of different types of functional areas of the substrate to be exposed. In this exemplary embodiment, an object of each full-page scan may be determined according to the priorities of different types of functional areas. For example, the exposure is performed in an order of the priorities from high to low, or, the exposure may be performed in an order of the priorities from low to high. Taking two types of functional areas, display area and non-display area, as an example, a priority of the display area may be higher than that of the non-display area. When the exposure is performed in the order of the priorities from high to low, the display area may be exposed through the first full-page scan and the non-display area may be exposed through the second full-page scan. However, the present embodiment is not limited thereto.

In some exemplary embodiments, in any full-page scan process, N exposures may be implemented through N scans for any pattern to be exposed in any functional area. In a direction perpendicular to a scan direction, a misalignment between the $(n+1)^{th}$ scan and the $n^{th}$ scan is $(1/N) \times d$, and an exposure dose of each scan in the N scans may be M/N. Where d is a scan width of each scan, M is a set exposure dose, N is a positive integer, and n is a positive integer less than N. In this exemplary embodiment, the same pattern to be exposed is exposed by multi-scan, which can improve the display homogeneity of the scan splicing boundary.

In some exemplary embodiments, each lens of the digital exposure machine may perform P scans during any one of the N scans, where P is a positive integer. The scan areas of two adjacent lenses may have P−1 overlaps; or, an exposure dose of each lens in each scan may be M/(N×P), and the scan width of each lens in the $i^{th}$ scan may be (i/P)×d or ((P+1−i)/P)×d, where i is a positive integer less than or equal to P. In this exemplary embodiment, in the multi-scan mode for the pattern to be exposed, splicing positions of different lenses of the digital exposure machine may be used as scan areas within the lenses, that is, the scan areas of adjacent lenses overlap; or, the scan area of each lens is not overlapped, but is expanded in turn by multi-scan. In this exemplary embodiment, the exposure homogeneity of splicing positions of different lenses can be improved by setting multi-scan of the lens.

In some exemplary embodiments, any lens of the digital exposure machine may use multiple consecutive micromirrors in a DMD array for exposure according to reflection homogeneity of the DMD in any scan of a full-page scan. The multiple consecutive micromirrors may be located in a middle area of the DMD array, or close to the middle area of the DMD array. In this exemplary embodiment, the scan width of a scan may be determined by the number of selected micromirrors. The larger the number of selected micromirrors for a scan, the larger the scan width of this scan, and the shorter the time it takes to complete the full page scan. Since the reflection homogeneity in the middle area of the DMD array is better, the exposure homogeneity can be improved by selecting multiple consecutive micromirrors in the middle area or close to the middle area of the DMD array for scan exposure.

In some exemplary embodiments, different lenses may use the same number of consecutive micromirrors when multiple lenses of the digital exposure machine are started to perform a parallel exposure.

In some examples, a scan speed may be set directly in the digital exposure machine or a parameter affecting the scan speed may be set to implement different scan speeds. However, the present embodiment is not limited thereto.

A maximum scan speed of the digital exposure machine during the exposure may be expressed by the following formula:

$$\text{scan speed} = \frac{DMD \text{ exposure length}}{\text{Multiplicity} \times (\max rast\ cnt + \text{shot time} + DMD \text{ reset time})}$$

Where scan speed indicates the maximum scan speed of the digital exposure machine. DMD exposure length indicates an exposure length of the DMD. Taking a DMD array, composed of 2560×1600 micromirrors, as an example, the exposure length of the DMD may be about 2 millimeters (mm) after optical scaling. Multiplicity indicates the number of times for which the micromirror is turned on at the same exposure position, which may generally be set to 80 times. max cast cnt indicates a maximum data transmission duration. Shot time indicates a turned-on duration of a micromirror, which is related to setting of an exposure dose, and may generally be 2 μs. DMD reset time indicates a duration required by the micromirror from end of receiving of a signal to re-receiving of the signal, which generally may be 10.4 μs.

Figure 3:
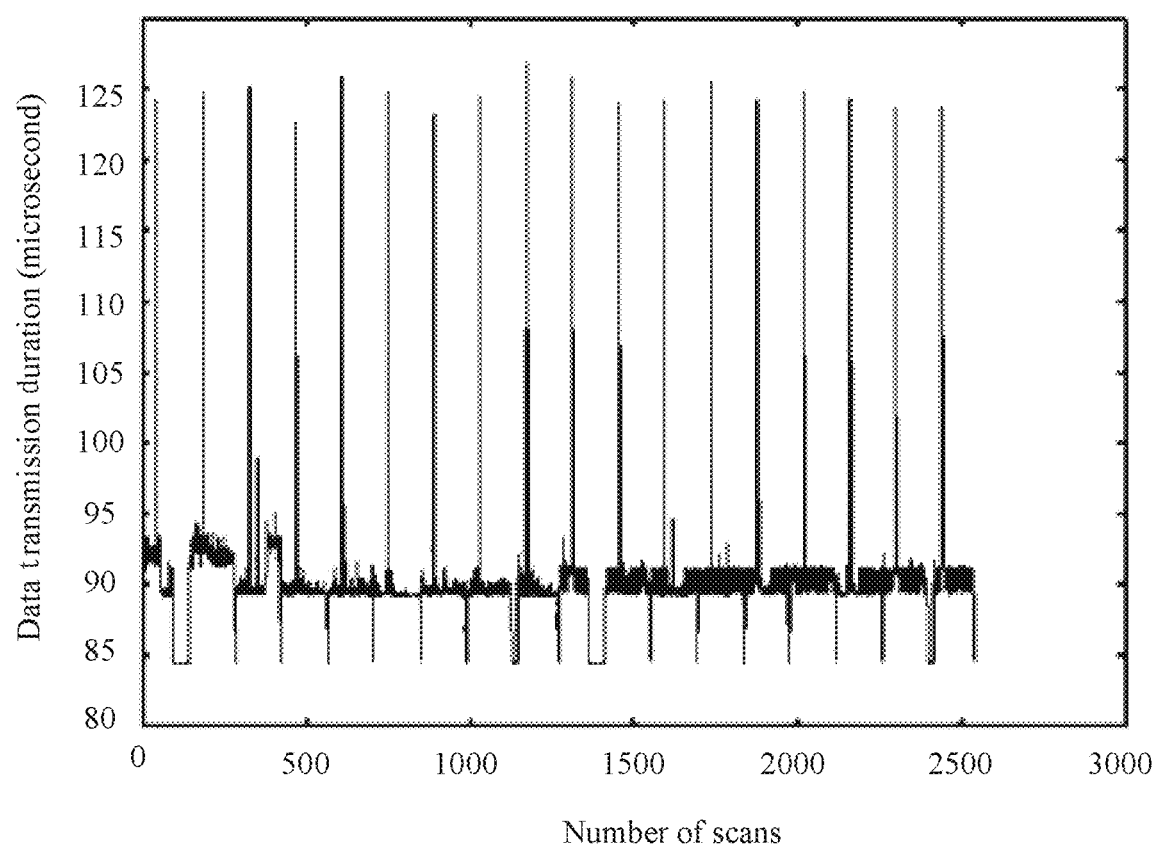
FIG. 3 is a schematic diagram of data transmission duration of each scan during an exposure.

FIG. 3 is a schematic diagram of data transmission duration of each scan during an exposure. In FIG. 3, an abscissa indicates the number of scans and the ordinate indicates the data transmission duration. It can be seen from FIG. 3 that the data transmission duration of most scans is below 95 μs, and only a few scans are increased to about 125p, which is equivalent to an increase of more than 30% data transmission duration. It can be seen that a main limiting factor of the scan speed of the digital exposure machine is data transmission and processing process.

In some exemplary embodiments, the digital exposure control method provided in this embodiment may further include: obtaining an original design pattern of a substrate to be exposed; performing a rasterization processing on the original design pattern by using a basic cell with a regular shape to obtain a pattern to be exposed. In some examples, the regular shape may be a square. However, the present embodiment is not limited thereto. In some examples, the regular shape may be a rectangle. In this exemplary embodiment, a basic cell with a regular shape is used as a repeating cell to rasterize the original design pattern, which can reduce the data transmission and processing duration of the pattern, thus improving the scan speed and the exposure efficiency.

In some exemplary embodiments, the digital exposure control method provided in this embodiment may further include: obtaining an original design pattern of a substrate to be exposed; performing a rasterization processing on the original design pattern by using a basic cell with a regular shape to obtain a rasterized pattern, and scaling the rasterized pattern to obtain a scaled pattern, and performing a rasterization processing on the scaled pattern by using the basic cell to obtain a pattern to be exposed. In this exemplary embodiment, the pattern to be exposed is obtained by adjusting a size of the rasterized pattern obtained by the first rasterization, which can improve rough edges of the exposed pattern in the digital exposure process, thereby improving the exposure effect.

In some exemplary embodiments, different pattern cells in the original design pattern may be rasterized by using basic cells with different sizes. This exemplary embodiment can improve the data processing speed, thereby shortening the exposure duration.

In some exemplary embodiments, the digital exposure control method of this embodiment may further include: allocating the pattern to be exposed of the substrate to be exposed to each lens of the digital exposure machine according to an alignment result between the substrate to be exposed and the digital exposure machine, and generating data required for each scan. The data required for each scan may include a scan boundary and the pattern to be exposed corresponding to a scan area.

In some exemplary embodiments, allocating the pattern to be exposed of the substrate to be exposed to each lens of the digital exposure machine according to the alignment result between the substrate to be exposed and the digital exposure machine, and generating the data required for each scan may include at least one of the following:

the scan boundary of each scan is determined according to the guidance box in the pattern to be exposed; wherein, the guidance box is used for defining an area where scan splicing cannot appear;

according to a demarcable cell, a scan boundary of each scan is determined, wherein the demarcable cell includes one or more pixel cells.

In some exemplary embodiments, a width of the guidance box may be less than or equal to a maximum scan width.

In some exemplary embodiments, the pattern to be exposed of the substrate to be exposed may be divided into demarcable sub-cells including one or more pixel cells according to the alignment result between the substrate to be exposed and the digital exposure machine, and splicing scan is performed according to the boundaries of demarcable sub-cells, thereby breaking the regularity of scan boundary and improving the display Mura.

In some exemplary embodiments, for a pattern to be exposed at a boundary splicing position of two scans, a total exposure dose of the two scans may be equal to that at a non-splicing position. Since Critical Dimension differences of scan splicing positions are mainly caused by uneven distribution of exposure dose, in this exemplary embodiment a complementary setting is made for the exposure dose of the pattern to be exposed at the boundary splicing positions of two scans, thereby improving the display Mura of scan splicing positions.

In some exemplary embodiments, the pattern to be exposed may be divided into at least two frames of sub-patterns, and there are dislocations between different frames of sub-patterns, so each frame of sub-pattern is respectively exposed for multiple times. In this exemplary embodiment, multiple frames of sub-patterns are exposed in a frame jitter manner, which can improve sawtooth edges of the exposed patterns, thereby improving the exposure effect.

In some exemplary embodiments, multiple consecutive micromirrors may be used as a unit in each exposure. In this exemplary embodiment, the micromirrors in the DMD array are reused for exposure, which can improve sawtooth edges of the exposed patterns, thereby improving the exposure effect.

The digital exposure control method provided in this embodiment will be illustrated by examples below.

Figure 4:
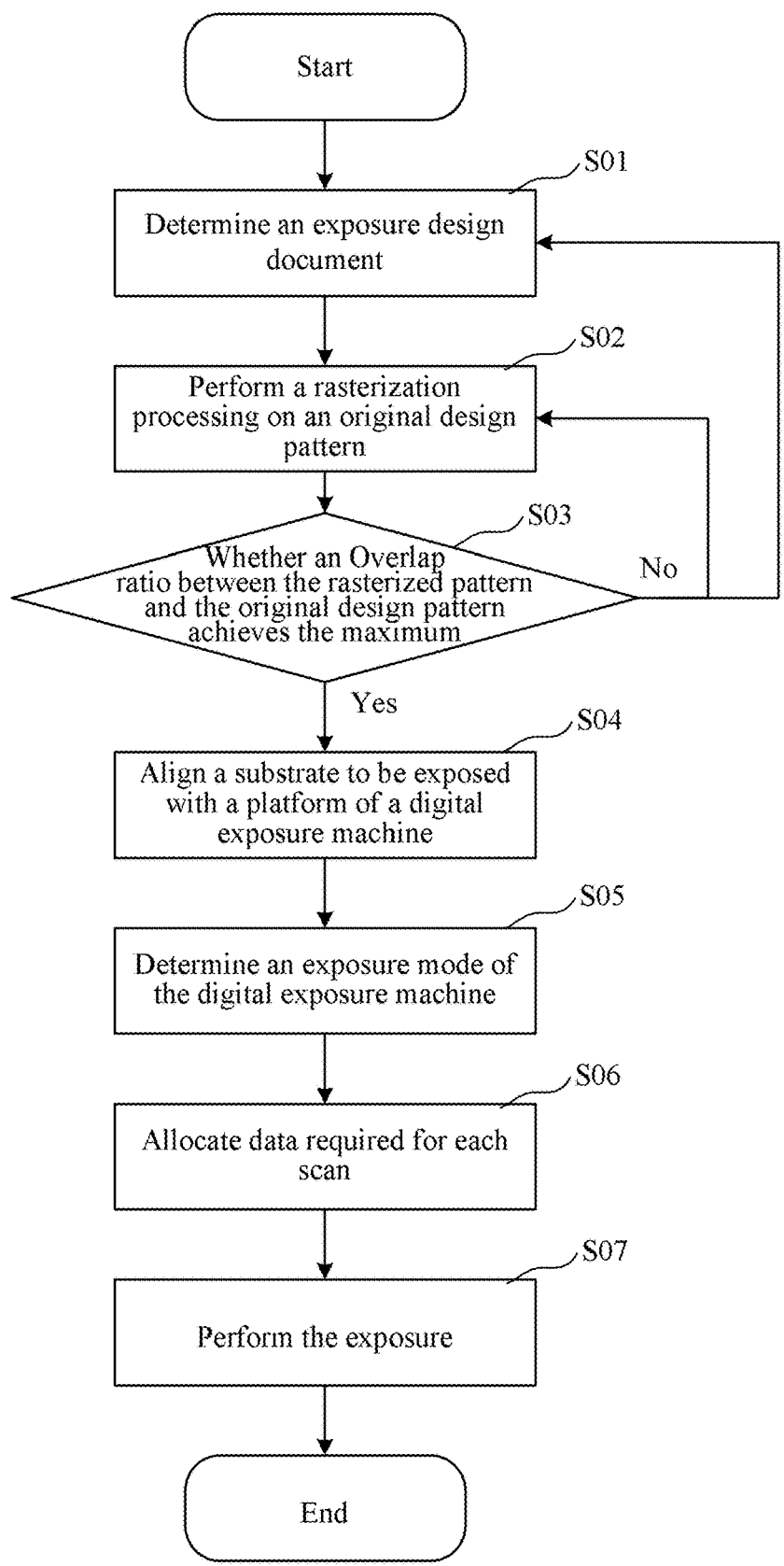
FIG. 4 is a flowchart of a digital exposure control method of at least one embodiment of the present disclosure.

FIG. 4 is a flowchart of a digital exposure control method of at least one embodiment of the present disclosure. The digital exposure control method provided by this exemplary embodiment may be used to expose a substrate to be exposed with various different types of functional areas. In some examples, the substrate to be exposed may include one or more display substrates, and sizes of the multiple display substrates may be the same or different. Each display substrate may include a display area and a non-display area located in the surrounding of the display area. In this example, the substrate to be exposed may include two types of functional areas, namely, a display area and a non-display area. However, the present embodiment is not limited thereto.

As shown in FIG. 4, the digital exposure control method in this exemplary embodiment may include acts S01 to S07.

In act S01, an exposure design document is determined.

In this exemplary embodiment, the exposure design document may include pattern layer data of each display substrate on the substrate to be exposed. The pattern layer data of each display substrate may include information of one or more pattern layers. The information of each pattern layer may include, for example, an original design pattern, names, positions, ranges and scan parameters (for example, scan priorities, scan speeds, exposure modes, etc.) of different functional areas. However, the present embodiment is not limited thereto.

In this exemplary embodiment, the exposure of each pattern layer in the exposure design document may be implemented in turn on the substrate to be exposed according to the following acts.

In act S02, a rasterization processing is performed on an original design pattern.

In this exemplary embodiment, a rasterization processing may be performed on the original design pattern by using a basic cell with a regular shape as a repeating cell to obtain the pattern to be exposed, wherein, the regular shape of the basic cell may be a square. However, the present embodiment is not limited thereto. In some examples, the base cell may be a rectangular. The shape of the basic cell may be determined according to a shape of a micromirror in a DMD array, for example, it may be the same as the shape of the micromirror, or may be a divided shape of the shape of the micromirror.

In some exemplary embodiments, the basic cell may be a square cell, and a side length of the basic cell may be 0.1 micrometer (μm), 0.2 μm, 0.3 μm or 0.5 μm. That is, there may be many different sizes for the base cell.

In some exemplary embodiments, the size of the basic cell may be determined according to the quality requirements of the pattern exposure. For example, a basic cell with a larger size may be selected for a pattern with simple exposure and high repeatability, for example, a basic cell with a side length of 0.3 or 0.5 μm may be selected. When a film layer with a high requirement on the homogeneity of critical dimensions, such as an anode layer pattern and a source/drain electrode (SD) layer pattern, a basic cell with a smaller size may be selected, for example, a basic cell with a side length of 0.1 μm may be selected to complete finer rasterization, thereby capable of more precisely restoring the original design pattern.

Figure 5:
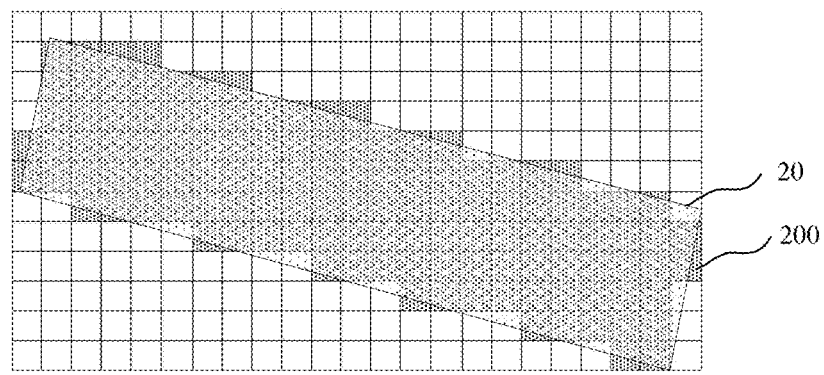
FIG. 5 is a schematic diagram of a rasterization processing of at least one embodiment of the present disclosure.

FIG. 5 is a schematic diagram of a rasterization processing of at least one embodiment of the present disclosure. As shown in FIG. 5, an original design pattern 20 may be rasterized by using a basic cell 200. In this example, the base cell 200 may be a square. A pattern obtained after a rasterization processing is performed on the original design pattern 20 is the shadow area in FIG. 5.

In this exemplary embodiment, it is easier to form the pattern to be exposed with repetitive cells by performing the rasterization processing on the original design pattern with the basic cell, which can reduce the data transmission duration of the pattern to be exposed, thereby improving the scan speed, reducing the exposure tact time, beneficial to improving the productivity of digital exposure products.

In some exemplary embodiments, the original design pattern may include multiple pattern cells (for example, a pattern cell may indicate a functional area), and the rasterization processing may be implemented with a pattern cell as an object. Sub-pattern cells may or may not be nested in the pattern cell. The same pattern cell may be rasterized by using the basic cell with the same size.

In some exemplary embodiments, different patterns cells in the original design pattern may be rasterized by using basic cells with different sizes as required. For example, a first pattern cell indicates a functional area with a higher requirement for exposure homogeneity, and a second pattern cell indicates a functional area with a lower requirement for exposure homogeneity, then the first pattern cell may be rasterized with a basic cell of a first size, and the second pattern cell may be rasterized with a basic cell of a second size, and the second size may be larger than the first size, so that the first pattern cell may be rasterized more precisely than the second pattern cell. In this exemplary embodiment, rasterization is performed for different pattern cells by using basic cells with different sizes, so that rasterization with different precisions can be achieved, the data processing speed can be improved, which is beneficial to shortening the tact time of the exposure.

In act S03, whether an overlap ratio between the pattern to be exposed obtained by the rasterization processing and the original design pattern achieves the maximum is determined.

In this exemplary embodiment, the overlap ratio of the pattern to be exposed obtained by the rasterization processing and the original design pattern may be used to determine the effect of the rasterization processing. Taking a pattern cell as an object, the higher the overlap ratio, the higher the degree of restoration of the original design pattern bought by the rasterization processing, and the better the effect of the rasterization processing.

In some exemplary embodiments, a formula for calculating an overlap ratio between a pattern to be exposed and an original design pattern may be as follows:

$$\frac{A \cap B}{A} \times 100\%;$$

Where A indicates the original design pattern, and B indicates the pattern to be exposed obtained after the rasterization processing is performed.

In this exemplary embodiment, when the overlap ratio between the pattern to be exposed obtained by the rasterization and the original design pattern achieves the maximum (for example, the overlap ratio is greater than or equal to a maximum threshold), act S04 may be performed. When the overlap ratio between the pattern to be exposed obtained by the rasterization and the original design pattern does not achieve the maximum (for example, the overlap ratio is less than the maximum threshold), the act may return to the act S01 or act S02. In some examples, when the overlap rate does not achieve the maximum, it may return to the act S01, that is, the original design pattern may be optimized. In some examples, when the overlap rate does not achieve the maximum, the act may return to act S02, that is, the rasterization processing may be optimized, for example, the shape or the size of the basic cell may be adjusted.

In act S04, a substrate to be exposed is aligned with a platform of a digital exposure machine.

In some exemplary embodiments, since a position of each substrate to be exposed on a platform is slightly different, an alignment mark on the substrate to be exposed may be captured to determine exact position of the substrate to be exposed on the platform. Later, according to the exact position of each substrate to be exposed, the data required for each scan may be allocated.

Figure 6:
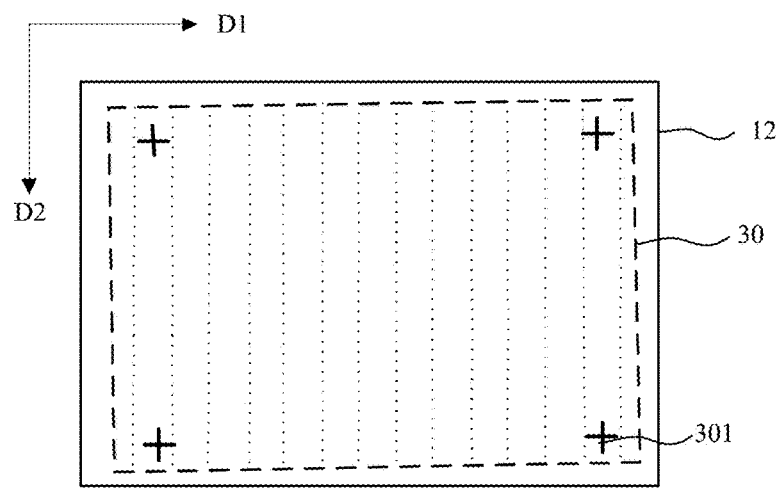
FIG. 6 is a schematic diagram of alignment between a substrate to be exposed and a platform of a digital exposure machine of at least one embodiment of the present disclosure.

FIG. 6 is an example diagram of alignment between a substrate to be exposed and a platform of a digital exposure machine of at least one embodiment of the present disclosure. As shown in FIG. 6, four corners of the substrate 30 to be exposed are respectively provided with an alignment mark 301. The digital exposure machine may determine the exact position of the substrate 30 to be exposed on the platform 12 according to the alignment marks 301 on the substrate 30 to be exposed. For example, the digital exposure machine may determine angles between an arrangement position of the substrate 30 to be exposed and a first direction D1 and between an arrangement position of the substrate 30 to be exposed and a second direction D2 according to recognized four alignment marks 301 of the substrate 30 to be exposed. In this example, areas between adjacent dashed lines in FIG. 6 may be the scan area corresponding to each group of scans of the digital exposure machine along the second direction D2.

In some exemplary embodiments, the platform 12 of the digital exposure machine may drive the substrate 30 to be exposed to move along the second direction D2, perform multiple scans in turn, then translate along the first direction D1 and perform multiple scans in turn along the second direction D2. The above process is repeated till the substrate 30 to be exposed is fully scanned, that is, a full-page scan is completed.

In act S05, an exposure mode of the digital exposure machine is determined.

In some exemplary embodiments, an exposure mode corresponding to each pattern layer may be obtained from the exposure design document. However, the present embodiment is not limited thereto. In some examples, the digital exposure machine may determine the exposure mode according to instructions received on a human-machine interactive interface.

In this exemplary embodiment, different functional areas may have different requirements for exposure homogeneity. In some examples, a first type functional area (e.g., the display area) has a higher requirement for exposure homogeneity, while a second type functional area (e.g., the non-display area in the surrounding of the display area, which may include a fanout area, a dummy area, etc.) has a lower requirement for exposure homogeneity. Therefore, different functional areas may be scanned and exposed at different scan speeds to ensure the requirements for exposure homogeneity of different functional areas, which can improve the production efficiency.

In some exemplary embodiments, the exposure of different types of functional areas of the substrate to be exposed may be performed through multiple full-page scans. The same type of functional areas may be exposed through the same full-page scan, and different types of functional areas may be exposed through different full-page scans. The substrate to be exposed may be aligned only once in multiple full-page scans, and an action of piece replacement is not performed until the multiple full-page scans of the substrate to be exposed is completed, that is, the substrate to be exposed is not replaced by a next piece of substrate to be exposed for scan and exposure.

Figure 7:
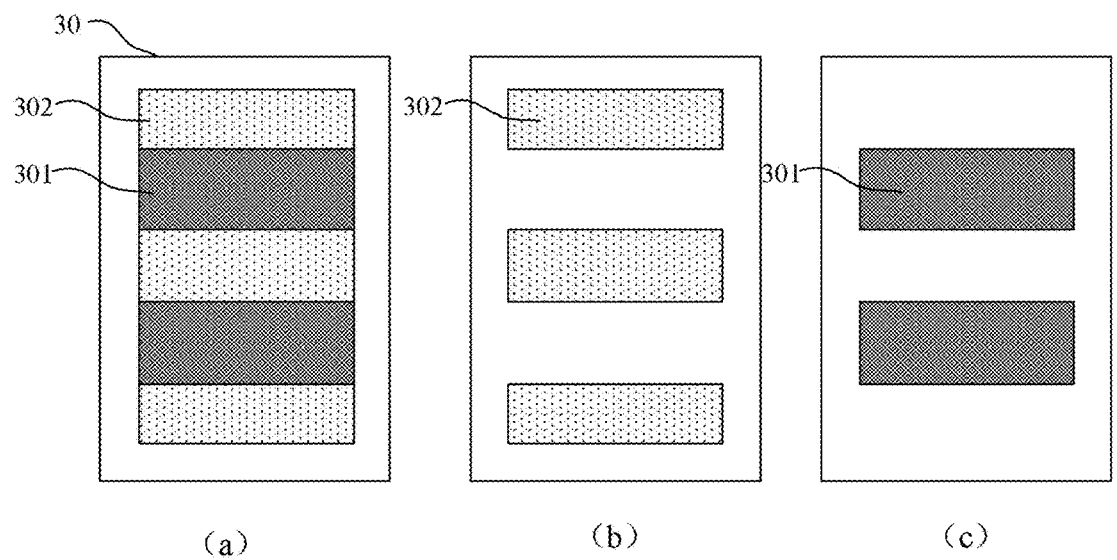
FIG. 7, including

FIG. 7, including FIGS. 7(a) to 7(c), is schematic diagrams of multiple full-page scans of at least one embodiment of the present disclosure. As shown in FIG. 7(a), in this exemplary embodiment, the substrate to be exposed 30 may include multiple first type functional areas (e.g., display areas) 301 and multiple second type functional areas (e.g., non-display areas) 302. The first type functional areas 301 and the second type functional areas 302 may be arranged at intervals. As shown in FIG. 7(b), the second type functional areas 302 of the substrate 30 to be exposed may be exposed through the first full-page scan. As shown in FIG. 7(c), the first type functional areas 301 of the substrate 30 to be exposed may be exposed through the second full-page scan. Full exposure of the substrate 30 to be exposed may be completed after two full-page scans. A scan speed in the first full-page scan is different from that in the second full-page scan. For example, the scan speed in the first full-page scan may be greater than that in the second full-page scan. In this example, since different types of functional areas are exposed separately in different full-page scans, during a full-page scan, when there is no pattern to be exposed in all lens ranges in a certain scan, it can be directly displaced to a next scan area to be exposed, thereby reducing the number of scans and improving the production efficiency. In this embodiment, an exposure order of different types of functional areas is not limited. In some examples, priorities of different types of functional areas may be set, and the exposure of different types of functional areas may be implemented in batches by performing full-page scans according to an order of priorities. For example, the functional areas with the high priority are preferentially exposed through the full-page scans.

In some exemplary embodiments, when different functional areas are exposed through multiple full-page scans, exposure parameters (e.g., exposure doses, focal lengths, scan widths, etc. of each scan) of different functional areas may be set separately without affecting each other.

Figure 8:
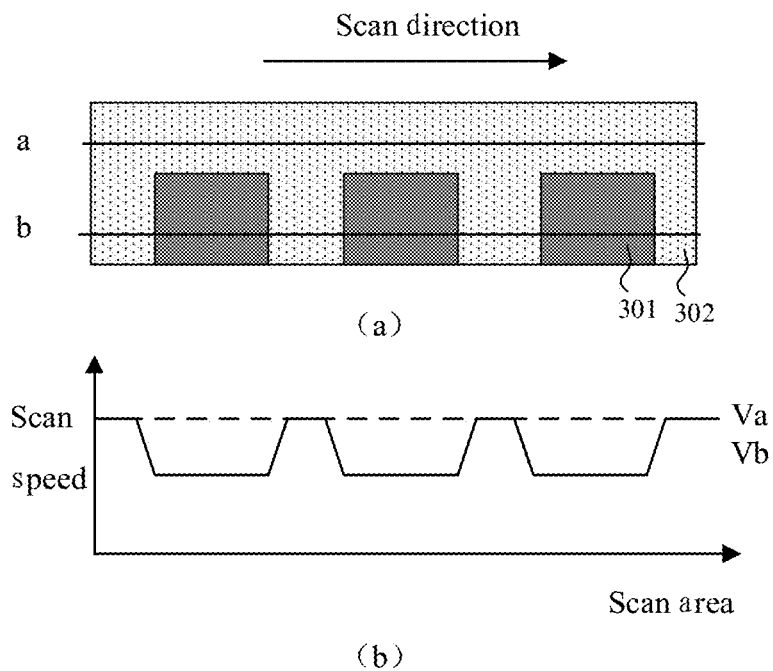
FIG. 8, including

In some exemplary embodiments, the exposure of different types of functional areas of the substrate to be exposed may be performed through one full-page scan. FIG. 8 is an example diagram of a full-page scan of at least one embodiment of the present disclosure. In FIG. 8(a), a and b respectively indicate a group of scans of a lens along a scan direction. A scan range of a first group of scans a may include the same type of functional areas (for example, the second type functional areas 302), or functional areas may not be distinguished. A scan range of the second group of scans b may include different types of functional areas, such as the first type functional areas 301 and the second type functional areas 302 arranged at intervals. In FIG. 8 (b), the abscissa indicates the scan areas, which corresponds to FIG. 8(a); the ordinate indicates the scan speed. As shown by the dashed line in FIG. 8(b), a scan speed Va of the lens in the first group of scans a remains constant. As shown by the solid line in FIG. 8(b), a scan speed Vb of the lens in the second group of scans b may be different. In this example, since the requirement for exposure homogeneity of the first type functional areas 301 is higher than that of the second type functional areas 302, the scan speed corresponding to the first type functional areas 301 may be lower than that corresponding to the second type functional areas 302. In some examples, different types of functional areas may have different priorities. As shown in the scan speed Vb of FIG. 8(b), the change of the scan speed of the lens may occur in the second type functional areas 302 with a low priority.

In some exemplary embodiments, if the scan areas of different lenses of the digital exposure machine correspond to different types of functional areas in any scan of a full-page scan, a scan speed corresponding to a functional area with a high priority may be used for this scan. In other words, the scan speeds of different types of functional areas may be the same in a scan, and a functional area with a low priority may be subordinate to the functional area with the high priority, that is, the scan is performed at the scan speed corresponding to the functional area with the high priority.

In this exemplary embodiment, when different types of functional areas of the substrate to be exposed are exposed by a full-page scan, exposure parameter arrangements among different types of functional areas will affect each other, and the number of parameters that may be altered is limited, such as a scan speed and a focus.

In some exemplary embodiments, based on scan by functional areas, a scan width of each scan may also be determined according to a DMD width. In any scan of a full-page scan, any lens may use multiple consecutive micromirrors in a DMD array for exposure according to reflection homogeneity of the DMD array.

Figure 9:
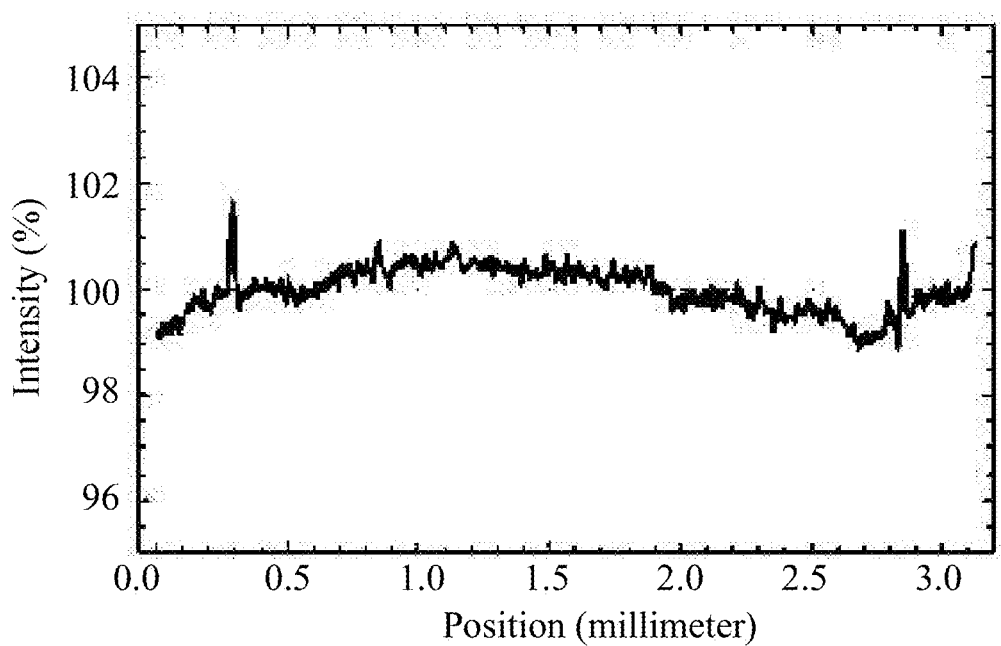
FIG. 9 is an example diagram of homogeneity of reflected light intensity of a DMD array.

FIG. 9 is an example diagram of the homogeneity of reflected light intensity of the DMD array. As shown in FIG. 9, the worse the reflection homogeneity in the edge area of the DMD array, the better the reflection homogeneity in the middle area. Therefore, any lens may use multiple consecutive micromirrors for exposure according to the reflection homogeneity of the DMD array, and the multiple consecutive micromirrors may be located in or close to the middle area of the DMD array. In some examples, the selected consecutive micromirrors may be the $3^{rd}$ to M-$3^{th}$ consecutive micromirrors, or the $2^{nd}$ to M-$4^{th}$ consecutive micromirrors along a row direction in FIG. 1. However, the present embodiment is not limited thereto.

In some exemplary embodiments, different lenses of the digital exposure machine may use the same number of consecutive micromirrors when multiple lenses are started to perform a parallel exposure. In a splicing position of different lenses, there may be a situation in which a width of an unexposed position is smaller than the scan width, so the digital exposure machine may automatically adjust the number of used micromirrors according to the data transmission, thereby ensuring to complete the full-scan scan exposure.

In this exemplary embodiment, the digital exposure machine may displace in a direction perpendicular to a scan direction according to the number of selected micromirrors. That is, the number of selected micromirrors determines a scan width of each scan. The more selected micromirrors, the greater the scan width of a scan and the shorter a duration for completing a full-page scan. In this exemplary embodiment, the scan width is adjusted by adjusting the number of selected consecutive micromirrors, which is beneficial to improving the exposure homogeneity.

In some exemplary embodiments, in a full-page scan, N exposures may be performed through N scans for any pattern to be exposed in any functional area, where N is a positive integer, that is, multi-scan exposures may be implemented. The exposure homogeneity of a scan splicing boundary can be improved by multi-scan exposures.

In this exemplary embodiment, in a direction perpendicular to a scan direction, a misalignment between the $(n+1)^{th}$ scan and the $n^{th}$ scan in N scans is $(1/N) \times d$, where d is a scan width of each scan, and an exposure dose of each scan is M/N, M is a set exposure dose, and n is a positive integer less than N.

Figure 10:
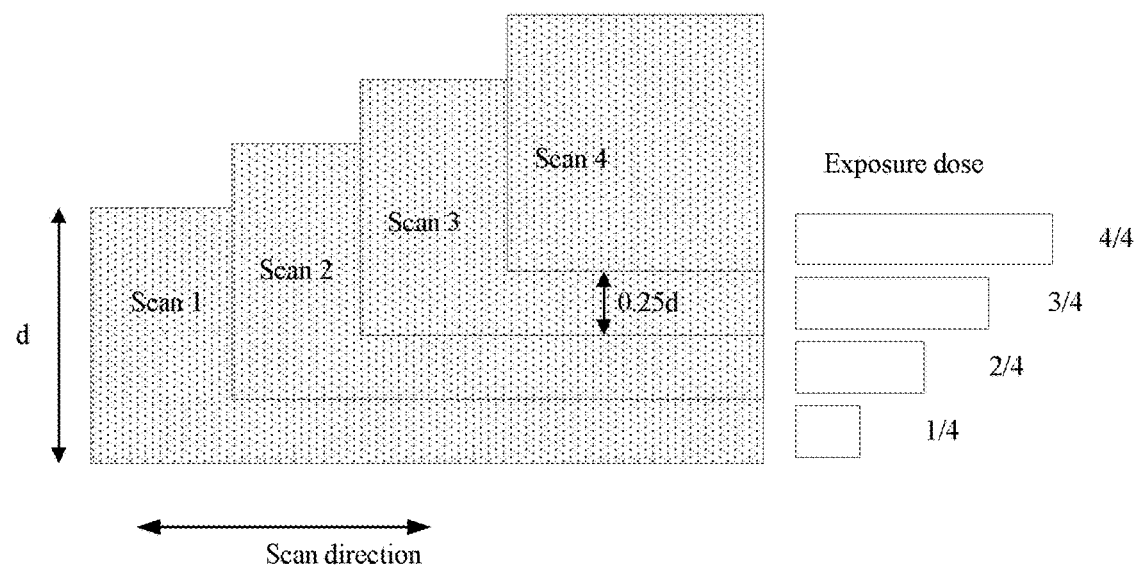
FIG. 10 is an example diagram of multi-scan exposure of at least one embodiment of the present disclosure.

FIG. 10 is an example diagram of multi-scan exposures of at least one embodiment of the present disclosure. As shown in FIG. 10, this example is illustrated by taking an example of performing scan exposure on a same pattern to be exposed for four times, that is, N=4. In this example, the digital exposure machine will expose the same pattern to be exposed for four times. For example, if a set exposure dose M is 30 MJ, an exposure dose of each scan is 30/4MJ. Scan width d of each scan may be the same. As shown in FIG. 10, in a direction perpendicular to the scan direction, a misalignment between two adjacent scans is 0.25 d, and the directions of two adjacent scans may be in the same or opposite direction. The second scan (scan 2) is performed after 0.25 d translation along the direction perpendicular to the scan direction is made after the first scan (scan 1), the third scan (scan 3) is performed after 0.25 d translation along the direction perpendicular to the scan direction is made after the second scan (scan 2), and the fourth scan (scan 4) is performed after 0.25 d translation along the direction perpendicular to the scan direction is made after the third scan (scan 3). In other words, in the direction perpendicular to the scan direction, the misalignment between the second scan (scan 2) and the first scan (scan 1) is 0.25 d, the misalignment between the third scan (scan 3) and the second scan (scan 2) is 0.25 d, and the misalignment between the fourth scan (scan 4) and the third scan (scan 3) is 0.25 d. The set exposure dose can be achieved in the scan area where four scans are superimposed.

In this exemplary embodiment, in any one of N scans, each lens of the digital exposure machine may perform P scans, where P is a positive integer. The scan areas of two adjacent lenses have P−1 overlaps; or, an exposure dose of each lens in each scan is M/(N×P), and a scan width of the lens in the $i^{th}$ scan may be $(i/P) \times d$, or $((P+1-i)/P) \times d$, where i is a positive integer less than or equal to P.

In this exemplary embodiment, splicing positions of different lenses may use any of the following processing modes. Mode 1: The splicing position is taken as the scan area in the lens, and there are P−1 scan overlaps between two adjacent lenses, and P is the number of times of multi-scan performed by the lens. Mode 2: The scan area of each lens is independent of each other. Taking a start-position scan as an example, an exposure dose of each scan may be 1/P, during P scans, the digital exposure machine does not translate in the direction perpendicular to the scan direction, a scan width of the first scan may be (1/P)×d, and then with expanding the scan width towards the scan area of the lens, a scan width of the second scan may be (2/P)×d. By analogy, a scan width of the $P^{th}$ scan may be d. After the lens completes P scans, the platform of the digital exposure machine may translate (1/N)×d along the direction perpendicular to the scan direction for the next scan. In an end-position scan, the exposure dose of each scan may be 1/P. During P scans, the digital exposure machine does not translate in the direction perpendicular to the scan direction. The scan width of the first scan may be d, and then with narrowing the scan width towards the scan area of the lens, a scan width of the second scan may be ((P−1)/P)×d. By analogy, a scan width of the $P^{th}$ scan may be (1/P)×d. In this example, the set exposure dose can be achieved at the splicing positions of different lenses through the multi-scan, thereby improving the exposure homogeneity at the splicing positions.

In some exemplary embodiments, scan exposure may be performed in combination with scan by functional areas and multi-scan exposures, or scan exposure may be performed in combination with scan by functional areas, multi-scan exposures and determining the scan width per scan according to the width of the DMD, so as to improve the exposure homogeneity and maximize the production efficiency. However, the present embodiment is not limited thereto.

In act S06, data required for each scan is allocated.

In this exemplary embodiment, the pattern to be exposed of the substrate to be exposed may be allocated to each lens of the digital exposure machine according to an alignment result between the substrate to be exposed and the digital exposure machine to generate data required for each scan.

In some exemplary embodiments, there is a guidance box in an original design pattern of the substrate to be exposed. In the original design pattern, the guidance box may be implemented by a special pattern layer or a special pattern cell. However, the present embodiment is not limited thereto. In this example, according to the position of the guidance box in the original design pattern, the position of the guidance box in the pattern to be exposed may be determined. The guidance box may be used for defining the areas where scan splicing cannot occur.

Figure 11:
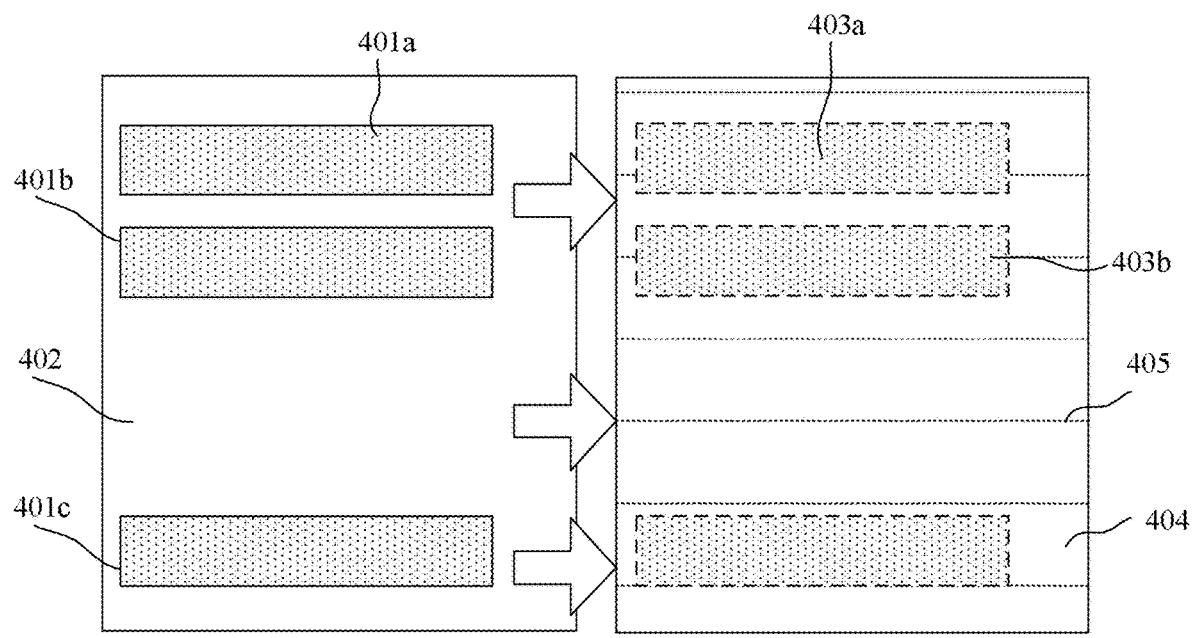
FIG. 11 is an example diagram of a guidance box of at least one embodiment of the present disclosure.

FIG. 11 is an example diagram of a guidance box of at least one embodiment of the present disclosure. As shown in FIG. 11, there may be guidance boxes 401a, 401b and 401c in a pattern to be exposed in the display area, but there is no guidance box in the area 402. The pattern after scan exposure is shown on the right side of FIG. 11, and the dotted line of 405 indicates a boundary of scan splicing. Guidance boxes 401a and 401b correspond to exposure areas 403a and 403b, in which no scan splicing boundary appears. The boundaries of the exposure areas 403a and 403b are indicated by dashed lines, indicating that the guidance box also introduces a new scan splicing boundary. The guidance box 401c corresponds to an exposure area 404, indicating that a width of the guidance box cannot exceed the maximum scan width. In some exemplary embodiments, the width of the guidance box is limited by the DMD array and a lens optical system, and the maximum width may be less than or equal to the maximum scan width.

In this exemplary embodiment, by arranging guidance boxes to define the positions where scan splicing cannot be performed, positions sensitive to critical dimensions may be protected from scan splicing, thereby improving the display homogeneity.

In some exemplary embodiments, pixel cells may form into a demarcatable cell, and scan splicing may be performed with the boundaries of demarcatable cells, thereby breaking the regularity of scan boundaries and improving the display homogeneity. As shown in FIG. 6, there may be a certain angle between the substrate to be exposed and the scan direction. If this angle is not considered during scan data allocation, the boundary of each scan will split the pixel cell in the display area, resulting in the pixel Mura.

Figure 12:
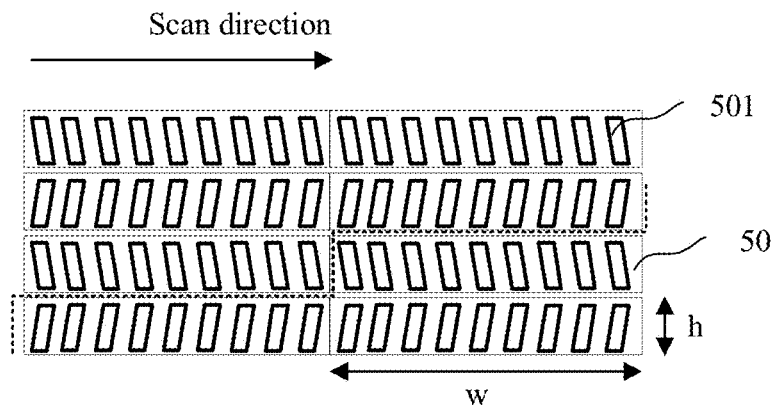
FIG. 12 is an example diagram of pixelated splitting of scan boundaries of at least one embodiment of the present disclosure.

FIG. 12 is an example diagram of pixelated splitting of a scan boundary of at least one embodiment of the present disclosure. As shown in FIG. 12, in this exemplary embodiment, a size of a pixel cell 501 and a size of a demarcation cell 50 may be defined. The demarcatable cell 50 may be composed of w×h pixel cells 501, where w and h are positive integers and the minimum values of w and h are 1, that is, the demarcatable cell 50 may include at least one pixel cell 501. In this example, the scan boundary is, for example, shown by the dotted line in FIG. 12. According to an alignment result between the substrate to be exposed and the platform, the number k of misaligned pixel cells between a start position and an end position of the scan in the direction perpendicular to the scan direction may be calculated. The number of sawteeth on the scan boundary may be controlled by adjusting the size of the demarcatable cell, where the number of the sawteeth m=K/h. Since the number of the sawteeth of the scan boundary will affect the homogeneity of data transmission and critical dimensions, the exposure homogeneity can be improved by adjusting the size of the demarcatable cell to control the number of the sawteeth on the scan boundary.

Figure 13:
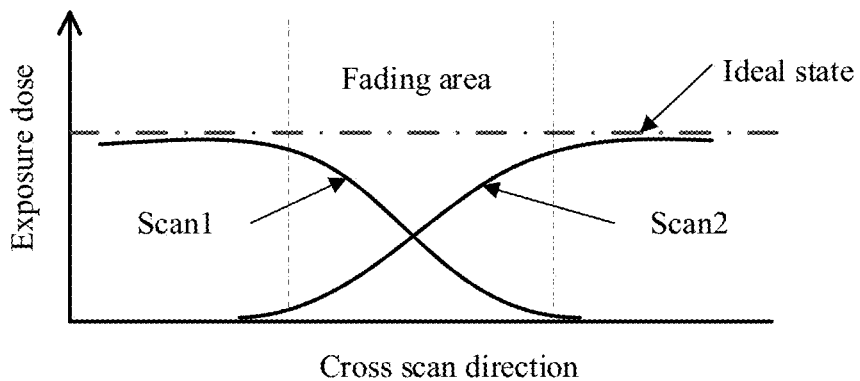
FIG. 13 is a schematic diagram showing complementary exposure doses of scan boundary splicing areas of at least one embodiment of the present disclosure.

In some exemplary embodiments, for the pattern to be exposed at the boundary splicing position of two scans, a total exposure dose of the two scans may be equal to the exposure dose of the pattern to be exposed at the non-splicing position. FIG. 13 is a schematic diagram showing complementary exposure doses of the splicing area of the scan boundary of at least one embodiment of the present disclosure. As shown in FIG. 13, an exposure fading area is arranged at the boundary splicing positions of two scans (scan 1 and scan 2). The total exposure dose of two scans (scan 1 and scan 2) in the exposure fading area may be consistent with the exposure of the area outside the exposure fading area, thereby improving the display homogeneity of the scan splicing position. Assuming that the exposure doses of the scan area in the direction perpendicular to the scan direction are $A_1A_2A_3 \ldots A_{n-1}A_n$, and the exposure doses allocated in Scan1 are $A_1A_2A_3 \ldots A_{i-1}(A_i-T)$, the exposure doses allocated in Scan2 may be $(T)A_{i+1} \ldots A_{n-1}A_n$. In this embodiment, a size of the exposure fading area is not limited.

In some exemplary embodiments, at least one of the guidance boxes, demarcatable cells and the exposure fading area complementary mode of the scan boundary may be used for performing scan data allocation, so as to reduce the Mura of the scan splicing position and improve the homogeneity of critical dimensions. However, the present embodiment is not limited thereto.

In act S07, the digital exposure machine performs the exposure.

In this act, the digital exposure machine may perform the scan exposure according to the data required for each scan.

According to the digital exposure control method provided by this exemplary embodiment, different scan speeds may be used to scan and expose functional areas with different requirements for the exposure homogeneity, so that the display homogeneity in the same type of functional areas can be ensured and the exposure efficiency can be improved. In addition, a rasterization processing may be performed on the original design pattern by using a square basic cell to obtain the pattern to be exposed, which can reduce data processing and transmission duration, thereby improving the scan efficiency. Moreover, the exposure homogeneity can be improved through the mode of determining the scan width of each scan according to the DMD width, the multi-scan exposure mode, the guidance box, the demarcatable cell, the mode of complementary of scan boundary exposure fading area or any combination of the above, thereby improving display homogeneity.

Figure 14:
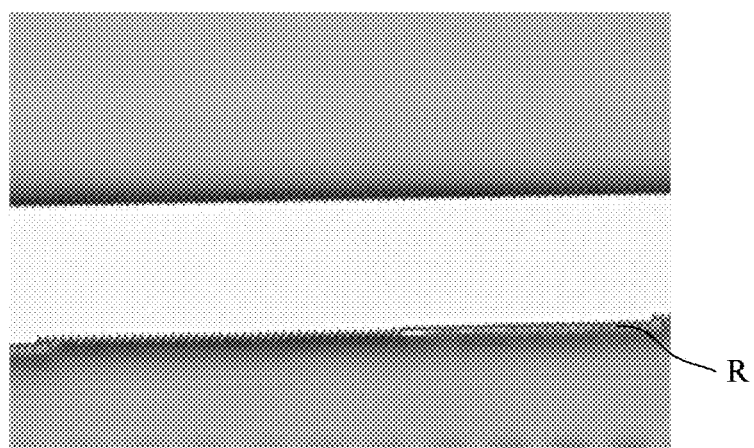
FIG. 14 is a schematic diagram of an exposure pattern.

Since the DMD array, the core component for digital exposure, is composed of pixelated micromirrors each of which may be controlled independently, it is easy to occur a situation in which coupling effect between different pixels during the exposure makes edges of the generated pattern rough, as the edge R in a sawtooth state shown in FIG. 14.

In some exemplary embodiments, the pattern to be exposed may be obtained by the following: performing a rasterization processing on the original design pattern with a basic cell having a regular shape to obtain rasterized pattern, scaling the rasterized pattern to obtain scaled pattern, and performing a rasterization processing on the scaled pattern with the basic cell to obtain the pattern to be exposed.

FIG. 15, including FIG. 15(a) and FIG. 15(b), is example diagrams of obtaining a pattern to be exposed of at least one embodiment of the present disclosure. In this exemplary embodiment, as shown in FIG. 15(a), a rasterization processing is performed on an original design pattern 60 by using a square basic cell, and a rasterized pattern 61, that is, a shadow pattern in FIG. 15(a), may be obtained. As shown in FIG. 15(b), the outermost basic cells 601 of the rasterized pattern 61 may be distinguished from the rest of the basic cells. At least two sides of the outermost basic cells 601 are not in contact with other basic cells. In some examples, there are three modes to perform a scaling processing of the rasterized pattern 61.

Mode 1: Outermost vertexes of the outermost basic cells are connected to obtain an enlarged boundary 62 (indicated by solid lines), and the rasterized pattern 61 may be enlarged according to the enlarged boundary 62.

Mode 2: Outermost vertexes of the secondary outer basic cells are connected to obtain a shrunken boundary 63 (indicated by dashed lines), and the rasterized pattern 61 may be shrunken according to the shrunken boundary 63.

Mode 3: A middle boundary between the enlarged boundary 62 and the shrunken boundary 63 is used as a scaling boundary to adjust the rasterized pattern. In some examples, a scale adjustment range of the rasterized pattern does not exceed two basic cells on each side, and the original design pattern needs to be altered if larger adjustment is required. However, the present embodiment is not limited.

In this exemplary embodiment, the rasterized pattern may be adjusted according to the exposure requirements of the products to obtain the adjusted pattern to be exposed, and the flexible control of the design and the process can be achieved. Furthermore, the exposure quality can be improved and the edge roughness of the exposure pattern can be improved.

In some exemplary embodiments, the exposure quality can be improved by reusing the micromirrors of the DMD array. FIG. 16 is a schematic diagram of micromirror reusing of a DMD array of at least one embodiment of the present disclosure. In this exemplary embodiment, during the exposure, multiple micromirrors may be used as a unit. As shown in FIG. 16, a position of a micromirror in the DMD array may be indicated by a combination of a row number (indicated by a number) and a column number (indicated by a letter). In some examples, a unit including multiple consecutive micromirrors may be a square, for example, four micromirrors A1: B2 may be used as a unit. Alternatively, a unit may be a rectangular, for example, twelve micromirrors A1: D3 may be used as a unit. In some examples, the position of the unit is not limited when micromirrors are reused. For example, four micromirrors A1: B2 may be used at the time point t1, and four micromirrors B2: C3 may be used at the time point t2.

Figure 17:
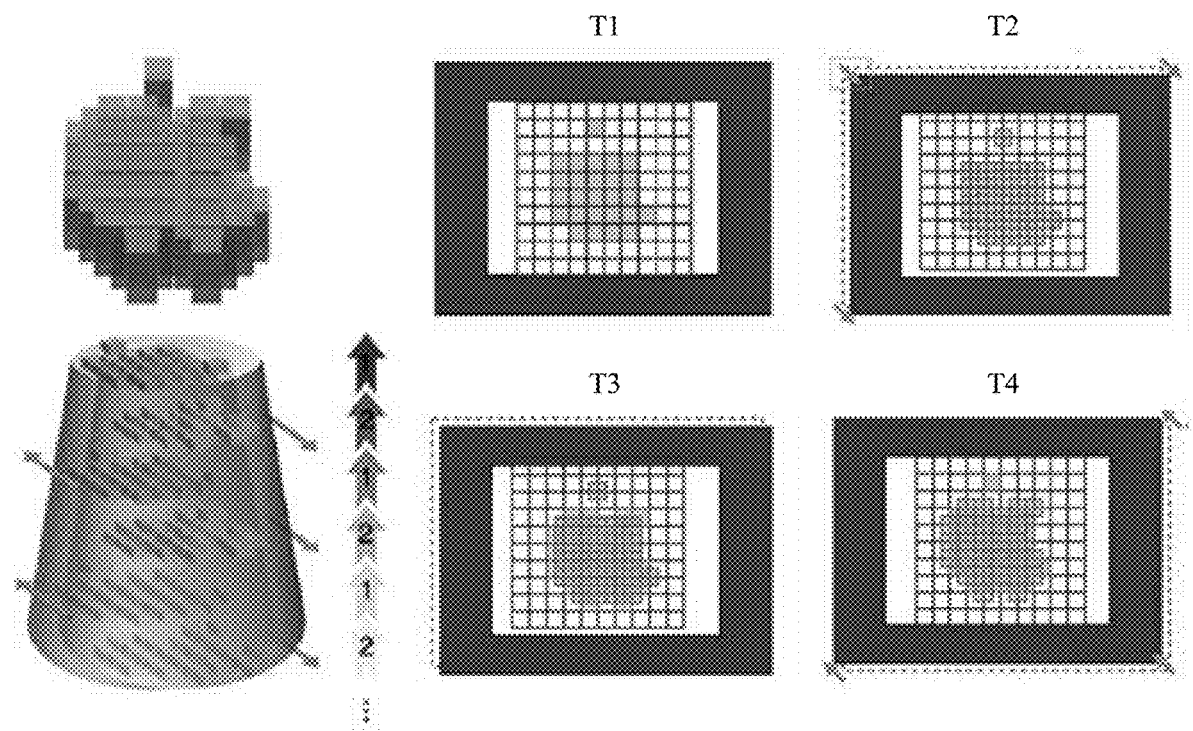
FIG. 17 is a schematic diagram of an exposure of a frame jitter mode of at least one embodiment of the present disclosure.

In some exemplary embodiments, the pattern to be exposed may be divided into at least two frames of sub-patterns, and each frame of the sub-pattern is exposed respectively, wherein there is a slight misalignment (frame jitter) between different frames of sub-patterns. A size and direction of the misalignment (frame jitter) may be set by the parameters of the digital exposure machine, and the size of the jitter or misalignment may generally be smaller than a size of a DMD micromirror spot. FIG. 17 is a schematic diagram of an exposure of a frame jitter mode of at least one embodiment of the present disclosure. As shown in FIG. 17, the pattern to be exposed obtained after rasterizing may be divided into two frames of sub-patterns, such as sub-pattern 1 and sub-pattern 2, with frame jitter between them. Sub-pattern 1 may be exposed at the time point T1, sub-pattern 2 may be uploaded at the time point T2, sub-pattern 2 may be exposed at the time point T3, and sub-pattern 1 may be uploaded at the time point T4, back and forth. In this example, the pattern to be exposed may be obtained after patterns obtained after multiple exposures are performed are superimposed. In some examples, the sub-pattern of each frame may include all or part of the patterns to be exposed. In some examples, exposure doses superimposed by exposures of different frames of patterns may be the set exposure dose. In this example, the more the number of frames of the sub-patterns, the higher the degree of the restoration of the pattern to be exposed by the exposure result and the better the imaging quality. In this exemplary embodiment, exposure may be performed in a frame jitter mode to reduce the edge sawteeth of the imaging and better restore the original design pattern, thereby improving the exposure quality.

In some exemplary embodiments, at least one of rasterized pattern scaling, DMD micromirror reusing and frame jitter exposure may be used to improve the exposure quality. However, the present embodiment is not limited thereto.

The digital exposure control method provided in this embodiment can not only improve the display homogeneity and product yield, but also shorten the tact time of the exposure, which is beneficial to improving the yield and productivity of digital exposure products and supporting the application of digital exposure in mass production.

An embodiment of the present disclosure also provides a digital exposure control apparatus, which includes a memory and a processor, wherein the memory stores a computer program, and when the computer program is executed by the processor, the digital exposure control method described in any of the above embodiments is implemented.

An embodiment of the present disclosure may further provide a digital exposure machine, which may include the above digital exposure control apparatus, a platform for bearing the substrate to be exposed, and a scan part. The above description may be referred to with respect to the platform and the scan part, so they will not be described repeatedly here.

In addition, an embodiment of the present disclosure also provides a non-transient computer readable storage medium where a computer program is stored, and when the computer program is executed, any digital exposure control method described above is implemented.

Those of ordinary skill in the art will understand that all or some of the acts, systems, and functional modules/cells in the methods disclosed above may be implemented as software, firmware, hardware, and appropriate combinations thereof. In hardware implementations, the division between functional modules/cells mentioned in the above description does not necessarily correspond to the division of physical components. For example, a physical component may have multiple functions, or a function or act may be performed by several physical components in cooperation. Some or all of the components may be implemented as software executed by a processor, such as a digital signal processor or a microprocessor, or as hardware, or as an integrated circuit, such as an application specific integrated circuit. Such software may be distributed on computer readable media, which may include computer storage media (or non-transitory media) and communication media (or transitory media). As is well known to those of ordinary skill in the art, the term "computer storage media" includes volatile and non-volatile, removable and non-removable media implemented in any method or technology for storing information such as computer readable instructions, data structures, program modules or other data. Computer storage media include, but are not limited to, RAMs, ROMs, EEPROMs, flash memories or other memory technologies, CD-ROMs, Digital Versatile Disk (DVD)s or other optical disk storage, magnetic cassettes, magnetic tapes, magnetic disk storage or other magnetic storage devices, or any other media that may be used to store desired information and may be accessed by a computer. Furthermore, it is well known to those of ordinary skill in the art that communication media typically contain computer readable instructions, data structures, program modules, or other data in a modulated data signal such as a carrier or another transmission mechanism, and may include any information delivery medium.

Although embodiments disclosed in the present disclosure are as the above, the described contents are only embodiments used for facilitating understanding the present disclosure, and are not used to limit the present disclosure. Any person skilled in the art to which the present disclosure pertains may make any modifications and variations in the implementation form and details without departing from the spirit and the scope of the present disclosure, but the patent protection scope of the present disclosure shall still be subject to the scope defined in the appended claims.

What we claim is:

1. A digital exposure control method, comprising:
   performing exposure of multiple functional areas of a substrate to be exposed through one or a plurality of full-page scans, wherein the multiple functional areas are of different types, scan speeds for the multiple functional areas of the substrate to be exposed are different;
   wherein, during any full-page scan, for any pattern to be exposed in any functional area, N exposures are performed through N scans; wherein in a direction perpendicular to a scan direction, a misalignment between an $(n+1)^{th}$ scan and an $n^{th}$ scan is $(1/N) \times d$, where d is a scan width of each scan, and an exposure dose of each scan is M/N, and M is a set exposure dose; N is a positive integer, and n is a positive integer less than N.

2. The digital exposure control method of claim 1, wherein the multiple functional areas have different priorities; when the exposure of the multiple functional areas of the substrate to be exposed is performed through one full-page scan, change of a scan speed occurs in a functional area with a low priority.

3. The digital exposure control method of claim 2, wherein, in any scan of one full-page scan, when scan areas of different lenses of a digital exposure machine correspond to multiple functional areas, the scan of the one full-page scan is performed with a scan speed corresponding to a functional area with a high priority.

4. The digital exposure control method of claim 1, wherein when the exposure of the multiple functional areas of the substrate to be exposed is performed through a plurality of full-page scans, a same type of functional areas are exposed through a same full-page scan.

5. The digital exposure control method of claim 4, wherein the multiple functional areas have different priorities; according to an order of the priorities of the multiple functional areas, the exposure of the multiple functional areas of the substrate to be exposed is performed by using a plurality of full-page scans.

6. The digital exposure control method of claim 1, wherein each lens of a digital exposure machine performs P scans during any one of the N scans, where P is a positive integer;
   wherein, scan areas of two adjacent lenses have P−1 overlaps; or, an exposure dose of each lens in each scan is $M/(N \times P)$, and a scan width of the lens in an $i^{th}$ scan is $(i/P) \times d$, or $((P+1-i)/P) \times d$, where i is a positive integer less than or equal to P.

7. The digital exposure control method of claim 1, wherein any lens of a digital exposure machine uses a plurality of consecutive micromirrors in a Digital Micromirror Device (DMD) array for exposure according to reflection homogeneity of the DMD array in any scan of one full-page scan.

8. The digital exposure control method of claim 7, wherein different lenses of the digital exposure machine use a same number of consecutive micromirrors when a plurality of lenses are started to perform a parallel exposure.

9. The digital exposure control method of claim 1, further comprising:
   obtaining an original design pattern of the substrate to be exposed;
   performing a rasterization processing on the original design pattern by using a basic cell with a regular shape to obtain a pattern to be exposed; or, performing a rasterization processing on the original design pattern by using a basic cell with a regular shape to obtain a rasterized pattern, scaling the rasterized pattern to obtain a scaled pattern, and performing a rasterization processing on the scaled pattern by using the basic cell to obtain a pattern to be exposed.

10. The digital exposure control method of claim 9, wherein the regular shape is a square.

11. The digital exposure control method of claim 9, wherein different pattern cells in the original design pattern are rasterized by using basic cells with different sizes.

12. The digital exposure control method of claim 9, further comprising:
allocating the pattern to be exposed of the substrate to be exposed to each lens of a digital exposure machine to generate data required for each scan according to an alignment result between the substrate to be exposed and the digital exposure machine.

13. The digital exposure control method of claim 12, wherein allocating the pattern to be exposed of the substrate to be exposed to each lens of the digital exposure machine to generate data required for each scan according to the alignment result between the substrate to be exposed and the digital exposure machine, comprises at least one of the following:
determining a scan boundary of each scan according to a guidance box in the pattern to be exposed; wherein, the guidance box is used for defining an area where scan splicing cannot occur; and
determining a scan boundary of each scan according to a demarcable cell, wherein the demarcable cell comprises one or more pixel cells.

14. The digital exposure control method of claim 12, wherein a total exposure dose of two scans is equal to that of a pattern to be exposed at a non-splicing position for a pattern to be exposed at a boundary splicing position of the two scans.

15. The digital exposure control method of claim 9, wherein the pattern to be exposed is divided into at least two frames of sub-patterns, and there is a misalignment between different frames of sub-patterns, and each frame of sub-patterns is respectively exposed for a plurality of times.

16. The digital exposure control method of claim 1, wherein at each exposure, a plurality of consecutive micromirrors are used as a unit.

17. A digital exposure control apparatus, comprising: a memory and a processor, wherein the memory stores a computer program, and when the computer program is executed by the processor, a digital exposure control method is implemented, comprising: performing exposure of multiple functional areas of a substrate to be exposed through one or a plurality of full-page scans, wherein scan speeds for the multiple functional areas of the substrate to be exposed are different;
wherein, during any full-page scan, for any pattern to be exposed in any functional area, N exposures are performed through N scans; wherein in a direction perpendicular to a scan direction, a misalignment between an (n+1)th scan and an nth scan is $(1/N) \times d$, where d is a scan width of each scan, and an exposure dose of each scan is M/N, and M is a set exposure dose; N is a positive integer, and n is a positive integer less than N.

18. A non-transitory computer readable storage medium storing a computer program, and when the computer program is executed, a digital exposure control method is implemented, comprising: performing exposure of multiple functional areas of a substrate to be exposed through one or a plurality of full-page scans, wherein scan speeds for the multiple functional areas of the substrate to be exposed are different;
wherein, during any full-page scan, for any pattern to be exposed in any functional area, N exposures are performed through N scans; wherein in a direction perpendicular to a scan direction, a misalignment between an (n+1)th scan and an nth scan is $(1/N) \times d$, where d is a scan width of each scan, and an exposure dose of each scan is M/N, and M is a set exposure dose; N is a positive integer, and n is a positive integer less than N.

19. A digital exposure machine comprising the digital exposure control apparatus of claim 17, a platform for bearing a substrate to be exposed, and a scan part.

* * * * *